United States Patent [19]
Park et al.

[11] Patent Number: 4,908,519
[45] Date of Patent: Mar. 13, 1990

[54] LOADING MECHANISM AND SUPPORT STRUCTURE HAVING IMPROVED VIBRATION DAMPING USEFUL IN SCANNING TUNNELING MICROSCOPY

[75] Inventors: Sang-il Park, Palo Alto; Calvin F. Quate, Stanford, both of Calif.

[73] Assignee: The Board of Trustees of the Leland Stanford Jr. University, Stanford, Calif.

[21] Appl. No.: 256,352

[22] Filed: Oct. 11, 1988

[51] Int. Cl.$^4$ .............................................. H01J 37/00
[52] U.S. Cl. .................................. 250/306; 250/442.1
[58] Field of Search ................... 250/306, 423 F, 442.1

[56] References Cited

U.S. PATENT DOCUMENTS 4,553,069 11/1985 Purser ............................... 250/442.1
4,762,966 8/1988 Bimming et al. .................. 250/442.1

OTHER PUBLICATIONS

"Variable Temp. Scanning Tunneling Micro", Lyding Rev. Sci. Inst. vol. 59, No. 9, Sep. 1988, pp. 1897–1902.
"Scanning Tunneling Microscope Inst.", Kuk et al., Rev. of Sci. Inst., vol. 60, No. 2, 2-89, pp. 165–170.
"Low-Temp. Atomic Force Microscopy", Kirk et al., Rev. Sci. Inst. vol. 59, No. 6, Jun. 1988, pp. 833–835.
"Scanning Tunneling Micro", Park et al., Rev. of Sci. Ins., vol. 58, No. 11, Nov. 1987, pp. 2010–2017.
"Vibration Isolation for STM", Okano et al., J. Vac. Sci. Tech., vol. 5, No. 6, Nov. 1987, pp. 3313–3320.

Primary Examiner—Bruce C. Anderson
Attorney, Agent, or Firm—Flehr, Hohbach, Test, Albritton & Herbert

[57] ABSTRACT

A sample and selective support structure mounted on a platform in a scanning tunneling microscope includes a double spring support with the springs overlapped to reduce overall length of the support. In a preferred embodiment, a rigid support structure supports a first platform. A second platform is positioned around and spaced from the first platform and includes a plurality of support members extending therefrom. A first set of springs is attached to the rigid support structure and to the second platform for supporting the second platform, and a second set of springs is attached to the second platform and to the first platform for supporting the first platform. By attaching the second set of springs to the rigid members extending from the second platform, the first and second sets of springs can be overlapped, thereby reducing the overall length of the spring support without reducing the effective length of the springs. A lock mechanism is provided for locking the first and second platforms when not in use, and includes a rod that engages holes in two members depending from the first and second platforms. The lock mechanism further includes first and second rigid arms pivotally attached to the rod and supported whereby the rigid arms extend from and retract to the rod when the rod is translated. When the rigid arms are extended from the rod, the arms engage lock mechanisms depending from the first platform, thereby achieving a rigid lock in six axes of motion.

13 Claims, 6 Drawing Sheets

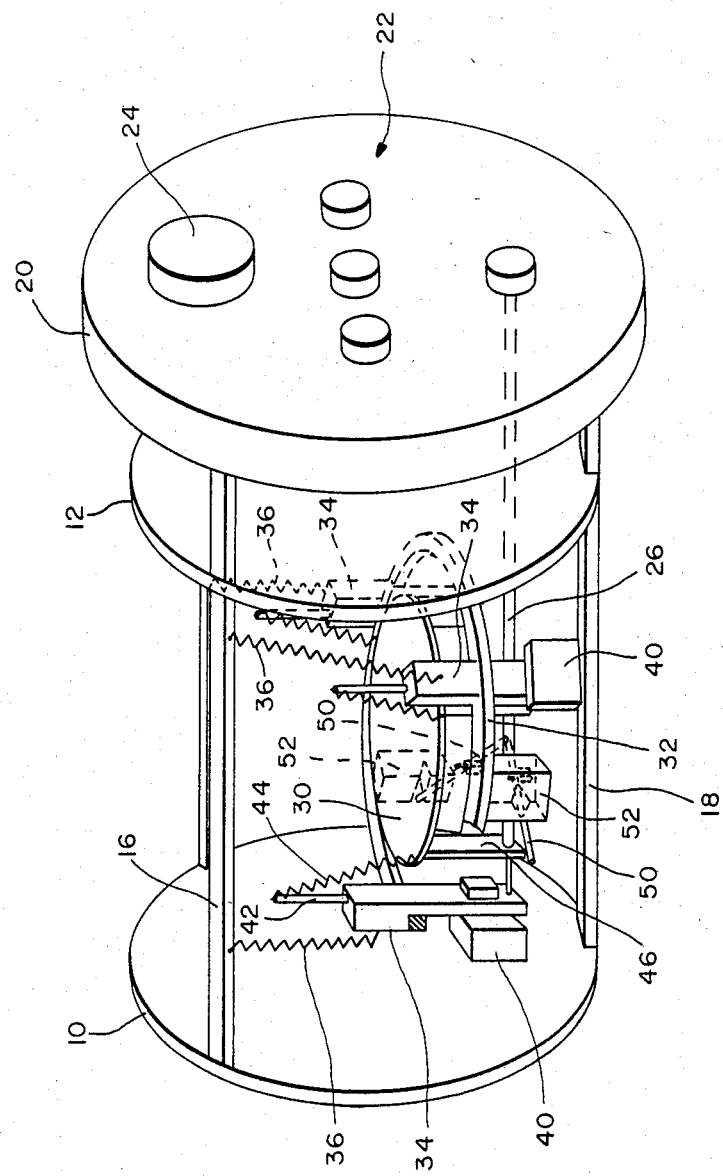
FIG.—1

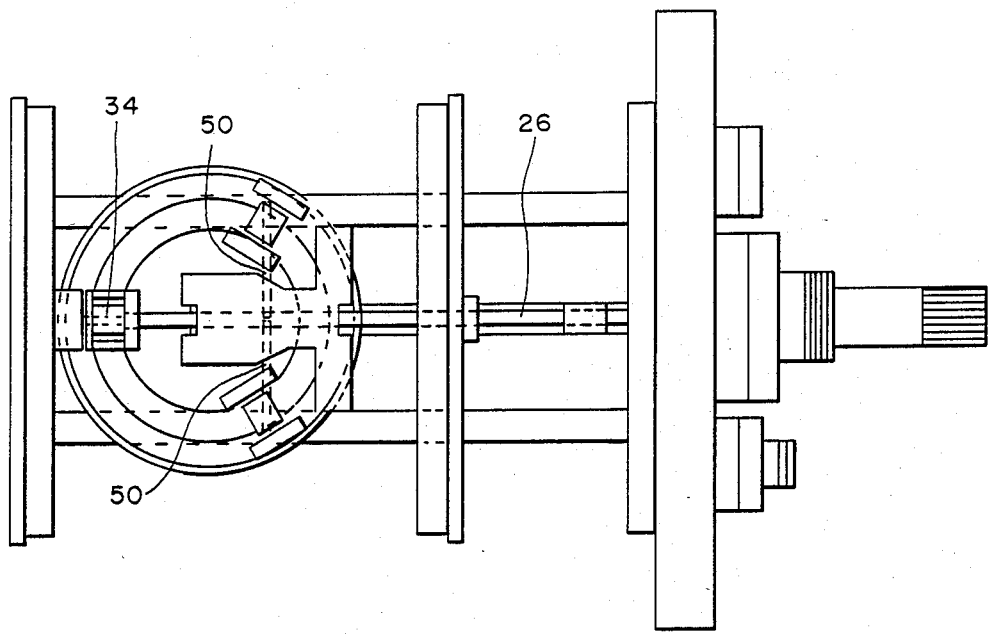
FIG.—2
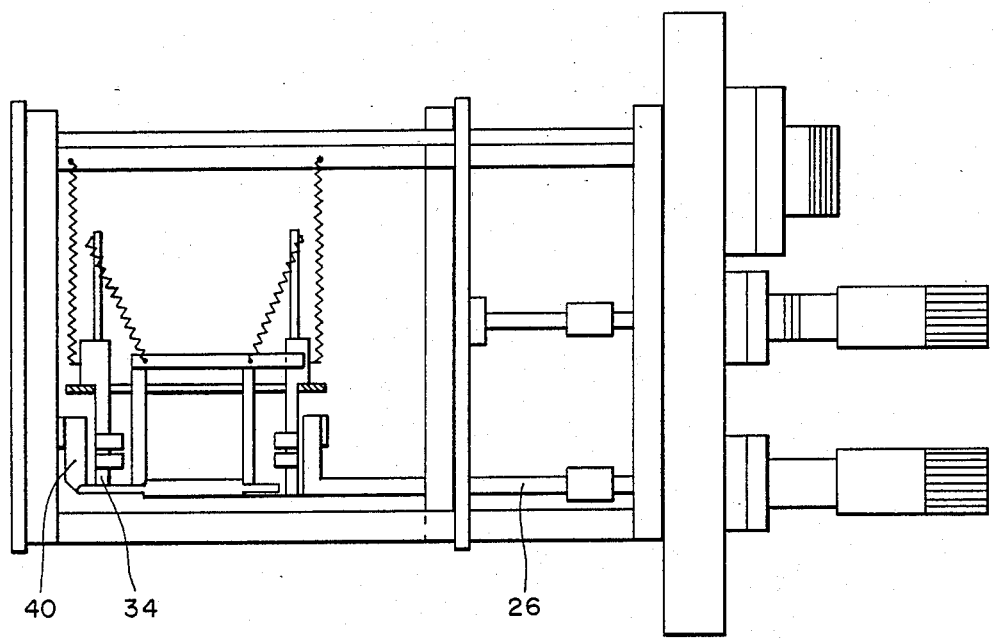
FIG.—3

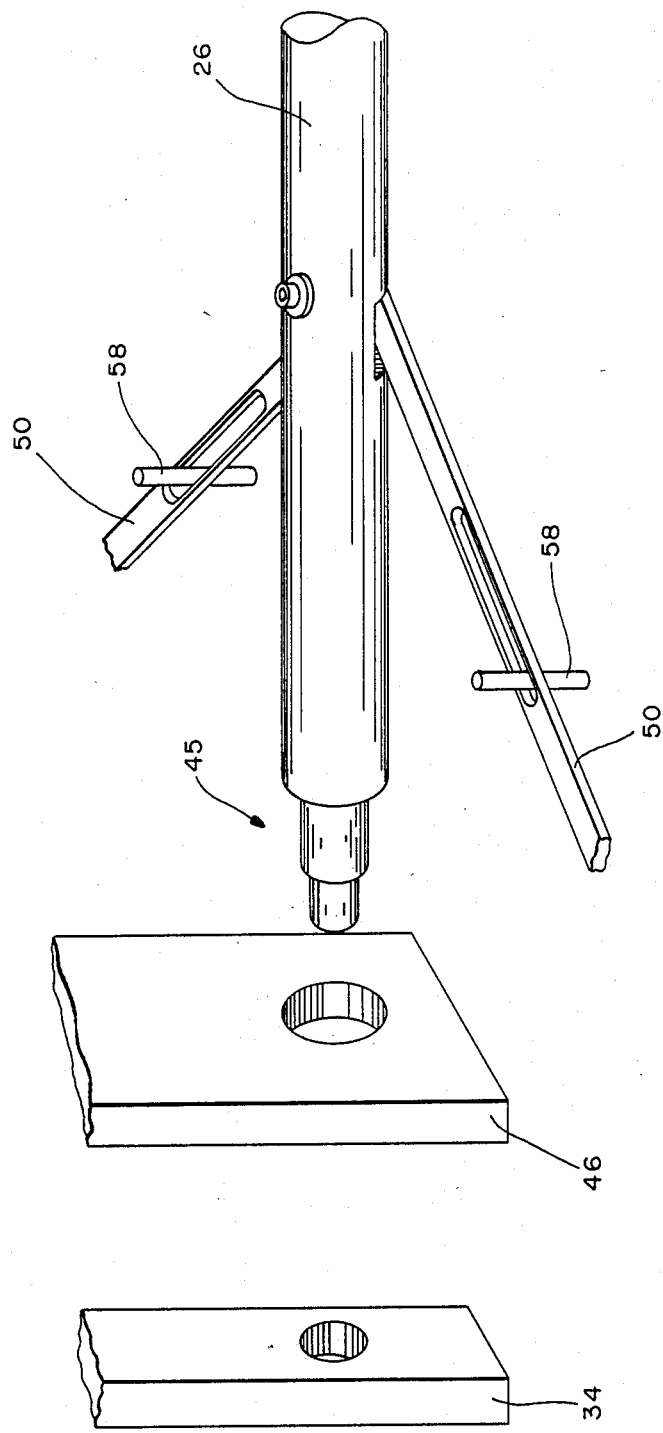
FIG.—4

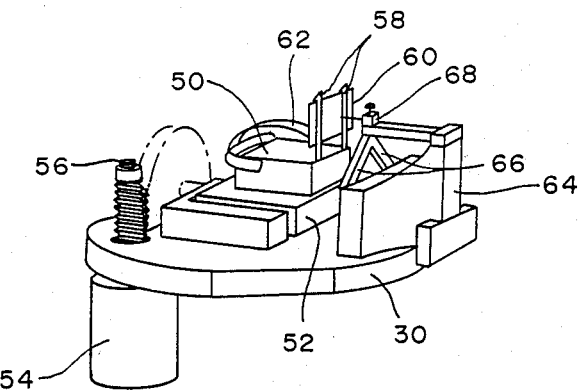
FIG.—5
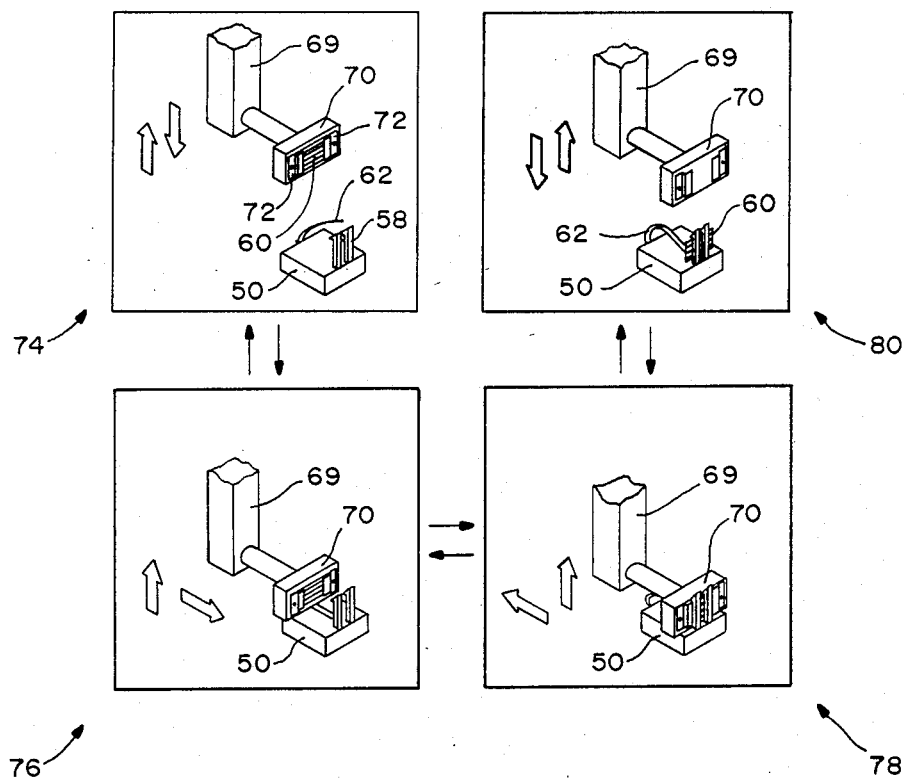
FIG.—6

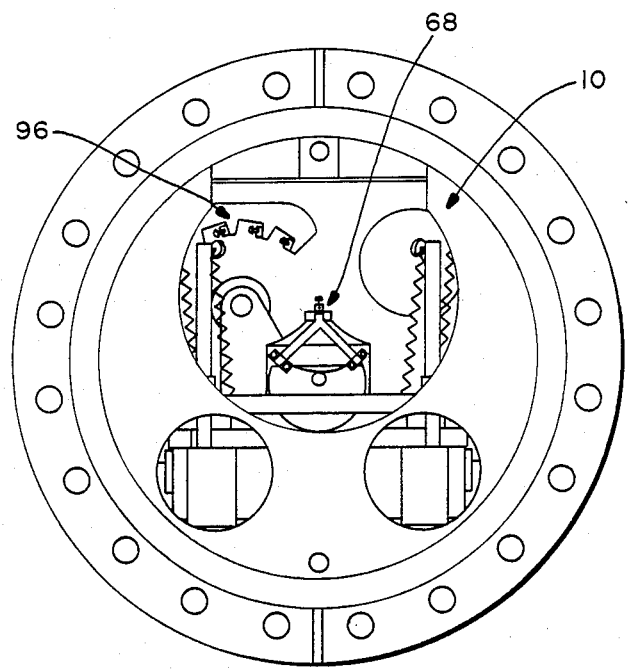
FIG.—7
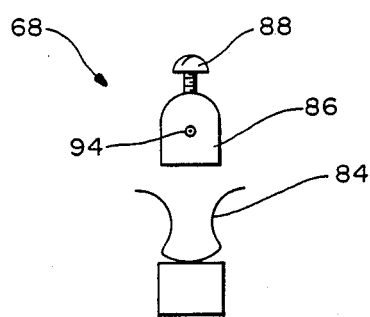
FIG.—8

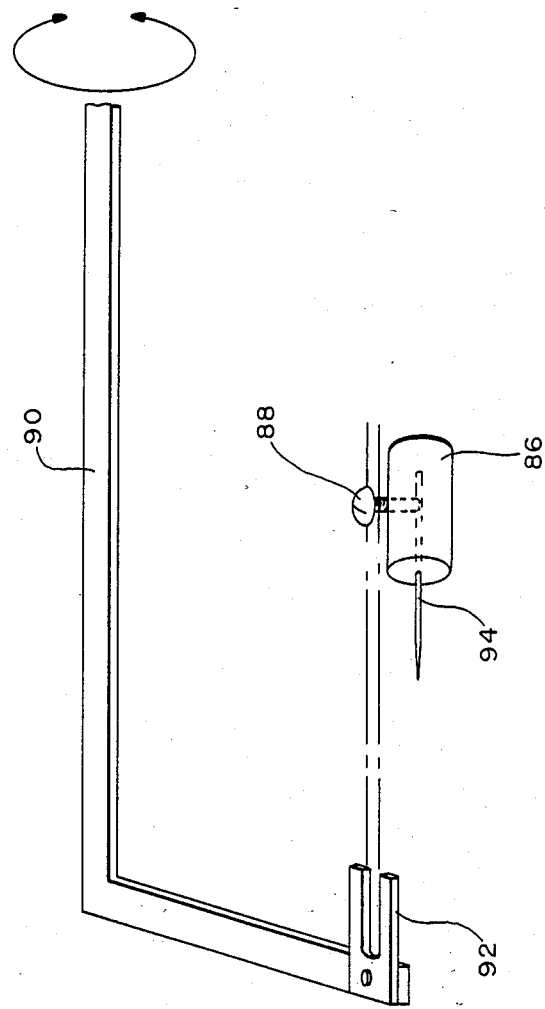
FIG.—9

LOADING MECHANISM AND SUPPORT STRUCTURE HAVING IMPROVED VIBRATION DAMPING USEFUL IN SCANNING TUNNELING MICROSCOPY

The U.S. Government has rights in the disclosed invention pursuant to DARPA Contract No. N00014-84-K-0624 with Stanford University.

BACKGROUND OF THE INVENTION

This invention relates generally to vibration damping in support structures, and more particularly the invention relates to a loading mechanism and a support structure having improved vibration damping especially useful in scanning tunneling microscopy.

The scanning tunneling microscope as introduced by Binnig et al. has proved to be a great tool for surface science as it can provide images which indicate the positions of individual atoms in real space. The microscope includes a vacuum chamber in which a support is provided for mounting a body having a surface to be examined. A very sharp tungsten-tipped electrode is brought into close contact with the surface. The electrode is biased with an appropriate tunneling voltage, and the distance between the electrode tip and the surface is indicated by the tunnel current flowing between the electrode and the surface. The electrode is mounted on a scanner consisting of three orthogonal piezoelectric bars. The scanner moves the tip with atomic precision along the three axes. The conducting specimen under study is mounted on the translation stage, and the sample is moved toward the tip until the gap between the tip and the sample becomes small enough for quantum mechanical tunneling to occur. The tunneling current is exponentially proportionate to the gap spacing, and, therefore, is very sensitive to changes in gap spacing. A feedback system detects the tunneling current and drives the vertical axis (Z) of the scanner so that the gap spacing is maintained at a constant value. Raster scanning is performed on the other axes (X, Y) while a computer records the displacement of the Z axis as a datum at each X, Y position. This two-dimensional data represents the geometry of the sample surface under the assumption that the constant work function and local density of states of the sample are both constant during the time of single image.

While the principle behind scanning tunneling microscopy is simple, many critical design considerations need to be solved in order to achieve atomic resolution. One such design consideration is the mounting of the specimen to minimize vibrations during movement of the electrode. Currently, two vibration isolation systems are used in scanning tunneling microscopy. The first on is a single coil spring suspension with magnetic damping, and the second is a stack of stainless-steel plates with Vitron dampers between each pair of plates. While both systems have been used in scanning tunneling microscopy instruments capable of recording images with atomic resolution, the second system is easy to build and relatively rigid so that it is convenient to manipulate the internal components. On the other hand, the system needs additional pneumatic suspension to improve the vibration isolation at low frequencies.

SUMMARY OF THE INVENTION

An object of the present invention is a support structure with improved vibration damping, especially useful in scanning tunneling microscopy.

A feature of the invention is a multiple-stage spring suspension system for a support platform as used in a scanning tunneling microscope.

Another feature of the invention is a lock mechanism for locking the suspended support platform when the microscope is not in use when the specimen or the electrode is being replaced.

Still another feature of the invention is a sample load and unload mechanism for loading and unloading samples mounted on a support platform.

Yet another feature of the invention is an electrode load and unload mechanism for exchanging electrodes between a scanner and electrode carousel mounted on a scanning tunneling microscope.

Briefly, in a scanning tunneling microscope application, a platform for holding a workpiece is suspended in a fixed support which is readily accommodated in a vacuum chamber and which facilitates external viewing of the work area in the vacuum chamber. The platform is suspended by a multiple-stage spring suspension with eddy-current damping for vibration isolation. In a two-stage system, the two sets of springs are overlapped in order to increase the efficiency of vibration isolation while reducing the physical size of the microscope to fit in the confined vacuum chamber.

A lock mechanism is provided to hold the multiple stages stationary when the microscope is not in use. The lock mechanism is operated from outside the vacuum chamber.

Mechanisms are provided for loading and unloading samples mounted on the support platform and for exchanging electrodes mounted on the scanner and electrode carousel.

The invention and objects and features thereof will be more readily apparent from the following derailed description and appended claims when taken with the drawing.

BRIEF DESCRIPTION OF THE DRAWING

FIG. 1 is a perspective view of a suspension system for a platform for use in a scanning tunneling microscope in accordance with one embodiment of the invention.

FIG. 2 is a top view of the suspension system of FIG. 1.

FIG. 3 is a side view of the suspension system of FIG. 1.

FIG. 4 is a perspective view of a portion of the lock mechanism in accordance with the preferred embodiment.

FIG. 5 is a perspective view of the platform including a sample holder and an electrode with a scanning device.

FIG. 6 illustrates a mechanism for loading and unloading a sample on the platform.

FIG. 7 is an end view of the platform illustrating the mounting of electrodes in a scanning tunneling microscope.

FIG. 8 is an enlarged end view of the electrode holder and an electrode in the end view of FIG. 7.

FIG. 9 illustrates a mechanism for loading and unloading electrodes.

DETAILED DESCRIPTION OF ILLUSTRATIVE EMBODIMENT

Referring now to the drawings, the main frame for the support structure is constructed with two circular aluminum discs 10 and 12, and three beams 14, 16 and 18 connecting the two discs. The two discs are configured to slide within a vacuum chamber, and the structure is sealed within the vacuum chamber by an end plate 20 which supports the two discs 10 and 12 on the beams 14, 16, 18. External controls for manipulating a workpiece (not shown) within the chamber are provided through the end plate 20 as shown generally at 22, and a visual microscope 24 is provided for viewing the workpiece. A linearly translatable lock mechanism including a rod 26 extends through the end plate 20 and disc 12 for locking the system, as will be described hereinbelow.

A support platform 30 for the scanning tunneling microscope is supported by the discs 10, 12 and beams 14, 16, 18 by a vibration-isolation system including a doublestage spring suspension with eddy-current damping. The first stage of the vibration-isolation system supports an annular ring 32 on which are mounted vertical extensions 34. Springs 36 extend from the beams 14, 16, and attach to the extensions or supports 34 for supporting the annular ring 32. Each vertical support 34 includes a magnet 38 which is positioned with a block 40 which is permanently affixed to a rail or a disc. The magnets provide eddy-current damping for the suspension system.

Extending from the vertical supports 34 are rods 42 from which a second set of springs 44 extends to engage and support the platform 30. The height of rods 42 is adjustable on the supports 34 whereby rods of different lengths can be readily accommodated. Further, each rod 42 and each support 34 is provided with a plurality of attachment points for the springs 36. In accordance with a feature of the invention, the two sets of springs are overlapped in order to increase the efficiency of vibration isolation and reduce the physical size of the microscope to fit on an 8" UHV flange.

Referring more particularly to FIGS. 2, 3 and 4, the rod 26 of the lock mechanism has a tip portion shown generally at 45 of a reduced diameter. The support 34 attached to the ring 32 has a hole therein of a diameter for receiving the tip portion 45 of rod 26. Similarly, a plate 46 depends from the platform 30 and has a hole of suitable diameter for receiving the tip 45. The plate 46 can have a hole of suitable diameter for receiving the rod 26. When the platform is unlocked for microscope operation, the tip portion 45 is removed from the support 34 and the vertical plate 46. To lock the platform 30, the rod 26 is linearly translated so that the tip portion moves through the plate 46 and into the hole in the support 34. Arms 50 move outwardly and engage notches in blocks 52 to effect a lock in six degrees of freedom. As shown in FIG. 4, the arms 50 are pivotally attached to rod 26 and have slots for receiving pins 58 which are stationarily fixed in the chamber. Thus, the arms 50 pivot on rod 26 as the rod moves linearly to lock and unlock the platforms.

In order to keep the centers of mass lower than the spring suspension point, the height of the posts on the middle stage is variable. Accordingly, the platform can be made stable regardless of the mass of additional components. An important consideration for choosing suspension points is that the lateral separation of one stage should be large compared to the spring length. Otherwise, other vibration modes can be excited such as swinging motions.

In one embodiment, all of the springs are made of 302 stainless steel for vacuum compatibility. In choosing the spring, the stretch length within the elastic limit of the spring must be determined. Further, the actual load on the spring should be equal to the force necessary to stretch the spring to its maximum length. Two parameters which determine the spring constant are the wire diameter and the winding diameter. It has been found that a larger winding diameter allows more expansion for the spring constant. Thus, the springs should have the largest outer diameter that can be accommodated within the allowed space of the vacuum chamber. The permanent magnets blocks of the damping mechanism must provide adequate damping, and in a preferred embodiment the magnets are cobalt-samarium ($SmCo_2$) magnets and the blocks are oxygen-free, high-conductivity copper.

Referring now to FIG. 5, the support platform 30 supports a sample holder 50 mounted on a translatable base 2 which is driven by a stepper motor 54 through a worm gear mechanism 56. Extending from the sample holder 50 are two parallel arms 58 having detents on one end for receiving a sample 60 undergoing test. The sample 60 is yieldably biased into engagement with the detents by means of spring 62.

Also mounted on the support platform 30 is a scanner 64 from which three piezoelectric bars 66 extend to support an electrode support structure 68. Typically, the tip of an electrode mounted in the electrode support structure can move up to one micron in three dimensions by the piezoelectric support members. The stepper motor 54 can linearly translate a sample approximately 8mm back and forth towards the electrode support structure.

In accordance with another feature of the invention, a mechanism is provided for loading and unloading samples in the sample support structure by operation from outside of the microscope housing. The operation of the mechanism is illustrated in FIG. 6 and includes an elongated member 69 which is translatable and rotatable relative to the sample support structure. A sample holder 70 is provided at one end of the elongated member 69 and includes clips 72 for slidably receiving a sample 60.

In loading the sample in the sample support structure, the elongated member 69 is moved from the position shown at 74 to the position shown at 76 and then translated towards the arms 58 until the sample 60 is engaged thereby. Spring 62 is depressed during this operation.

Once the sample engages the arms 58, as shown at 78, the elongated member 69 is translated away from the sample holder and the spring 62 is released, thereby yieldably biasing the sample into engagement with the detents on the end of the arms 58. Removal of a sample from the sample holder proceeds in a reverse direction from that shown at 80 to the position of 78, then to 76, and finally to 74.

FIG. 7 is an end view of the scanning tunneling microscope with a portion of end plate 10 having a large opening for sample transfer and viewing. This view further illustrates the position of the electrode on the electrode support structure 68. The electrode support structure 68 is shown enlarged in FIG. 8 with a clip 84 and electrode tip 94 and electrode body 86. An electrode body 86 is insertable into the clip 84 in pressure engagement. A screw 88 threadably engages the body 86 to maintain an electrode tip 94 in the body 86. As will be described further below with reference to FIG. 9, the screw 88 is also utilized in loading and unloading electrodes in the electrode support 68.

Referring now to FIG. 9, a mechanism for loading and unloading an electrode in the electrode support structure is illustrated. The mechanism includes an elongated arm 90 which is translatable and rotatable relative to the electrode support structure. A fork 92 is mounted on one end of the arm 90 with the fork configured for receiving the screw 88 threadably engaged to the body 86 which supports an electrode tip 94. Once the electrode is engaged by the fork 92, the electrode can be removed from the clip of the electrode support structure or inserted into the electrode support structure.

Referring back to FIG. 7, a plurality of electrode storage means (electrode carousel) shown generally at 96 are provided within the cavity of the microscope for storing a plurality of electrodes. Each of the storage means has a clip similar to the clip 84 of FIG. 8 for receiving an electrode for storage.

A description of a scanning tunneling microscope utilizing the suspension and lock mechanism in accordance with the invention, and the theory of the feedback and the vibration isolation system, are described in the following two papers authored by applicant: "Scanning Tunneling Microscope," Rev. Sci. Instum. 58 (11), Nov. 1987, pp. 2010–2017, and "Theories of the Feedback and Vibration Isolation Systems for the Scanning Tunneling Microscope," Rev. Sci. Instum. 58 (11), Nov. 1987, pp. 2004–2009.

A microscope embodying the invention (Model STM-SU2) is commercially available from Park Scientific Instruments, Palo Alto, Calif.

The multiple-stage spring suspension system with eddycurrent damping has proved to be particularly useful in a scanning tunneling microscope. However, the suspension system can be employed in other applications where vibration damping is critical. Thus, while the invention has been described with reference to a specific embodiment and application, the description is illustrative of the invention. Various modifications and applications may occur to those skilled in the art without departing from the true spirit and scope of the invention as defined by the appended claims.

We claim:

1. A system for a platform in a scanning tunneling microscope comprising
   a rigid support structure,
   a first platform within said rigid support structure,
   a second ring platform positioned around and spaced from said first platform and including a plurality of support members extending therefrom,
   a first plurality of springs attached to said rigid support structure and to said second platform for supporting said second platform, and
   a second plurality of springs attached to said second platform and to said first platform for supporting said first platform, said first plurality of springs and said second plurality of springs overlapping and thereby reducing the overall length of the spring support of said first platform from said rigid support structure.

2. The support system as defined by claim 1 wherein said plurality of rigid support members is variable in length.

3. The support system as defined by claim 2 wherein attachment points of said first plurality of springs to said second platform are on said plurality of rigid supports, said attachment points being at a plurality of points on said plurality of rigid supports.

4. The support system as defined by claim 3 wherein the attachment points of said second plurality of springs to said second platform are on said plurality of rigid supports.

5. The support system as defined by claim 1 and further including a lock mechanism for locking said first and second platforms, said lock mechanism including a first member depending from said first platform and having a hole therethrough, a second member depending from said second platform and having a hole therethrough, and a rod insertable into said hole in said first member and into said hole of said second member.

6. The support system as defined by claim 5 wherein said hole through said second member is smaller in diameter than the hole through said first member, said rod having an end portion with three different diameters whereby said end portion is insertable into said holes in close fit.

7. The support system as defined by claim 5 wherein said lock mechanism further includes first and second rigid members pivotally attached to said rod, support means for said first and second rigid members whereby movement of said rod extends and retracts said first and second rigid members, and lock members depending from said first platform for receiving said first and second rigid members when said rod is linearly translated.

8. The support system as defined by claim 1 and further including
   a sample support structure mounted on said first platform including means for slidably receiving a sample, and
   a mechanism for loading and unloading samples in said sample support structure, said mechanism including a first elongated member translatable and rotatable relative to said sample support structure, and a sample holder at one end portion of said elongated member for slidably loading and unloading samples into said sample support structure.

9. The support system as defined by claim 8 wherein said sample support structure supports a planar substrate and includes two parallel arms having detents at end portions for receiving the edge of a substrate, and spring means for yieldably biasing a substrate in engagement with said detents.

10. The support system as defined by claim 8 and further including
    an electrode support structure mounted on said first platform including
    clip means for receiving an electrode,
    an electrode including an electrode tip, a body for supporting said electrode tip, and a screw threadably engaging said body and maintaining said electrode tip in said body, and
    a mechanism for loading and unloading an electrode in said electrode support structure including a second elongated member translatable and rotatable relative to said electrode support structure, and fork means mounted to an end of said second elongated member for engaging said screw when loading and unloading an electrode in said electrode support structure.

11. The support system as defined by claim 10 and further including a plurality of electrode storage means supported by said rigid support structure for storing a plurality of electrodes, each electrode storage means including a clip for receiving an electrode.

12. Means for holding a planar sample during processing in a scanning tunneling microscope comprising
    a sample support structure for slidably receiving a sample, said sample support structure supporting a planar sample and including two parallel arms having detents at end portions for receiving the edge of a sample, and spring means for engaging a sample and yieldably biasing the sample in engagement with said detents, and a mechanism for loading and unloading samples in said sample support structure, said mechanism including an elongated member translatable and rotatable relative to said sample support structure, and a sample holder at one end of said elongated member for slidably loading and unloading samples into said sample support structure.

13. An electrode support structure for scanning tunneling microscope including clip means for receiving an electrode, an electrode including an electrode tip, a body for supporting said electrode tip, and a screw threadably engaging said body and maintaining said electrode tip in said body, and a mechanism for loading and unloading an electrode in said electrode support structure including an elongated member translatable and rotatable relative to said electrode support structure, and fork means mounted to an end of said elongated member for engaging said screw when loading and unloading an electrode in said electrode support structure.

* * * * *